United States Patent [19]

Anazawa et al.

[11] 3,946,428
[45] Mar. 23, 1976

[54] ENCAPSULATION PACKAGE FOR A SEMICONDUCTOR ELEMENT

[75] Inventors: Shinzo Anazawa; Seiichi Ueno; Isamu Nagasako; Tadashi Nawa; Toshiaki Irie; Shigeru Sando, all of Tokyo, Japan

[73] Assignee: Nippon Electric Company, Limited, Tokyo, Japan

[22] Filed: Sept. 17, 1974

[21] Appl. No.: 506,872

[30] Foreign Application Priority Data
Sept. 19, 1973 Japan.............................. 48-105715
May 24, 1974 Japan............................... 49-58958

[52] U.S. Cl. ...................... 357/74; 357/81; 357/84
[51] Int. Cl.²................ H01L 23/02; H01L 25/04
[58] Field of Search.......................... 357/74, 81, 84

[56] References Cited
UNITED STATES PATENTS

| | | |
|---|---|---|
| 3,651,434 | 3/1972 | McGeough et al................... 357/74 |
| 3,701,049 | 10/1972 | Van Iperen et al.................. 357/74 |
| 3,828,228 | 8/1974 | Wong et al. ......................... 357/81 |

Primary Examiner—Stanley D. Miller, Jr.
Assistant Examiner—E. Wojciechowicz
Attorney, Agent, or Firm—Hopgood, Calimafde, Kalil, Blaustein & Lieberman

[57] ABSTRACT

A semiconductor package device characterized by improved operation at ultra-high frequencies and by improved heat dissipation, includes an auxiliary metal stud mounted on a metal substrate. A semiconductor element, such as a field-effect transistor or bipolar transistor, is mounted on the auxiliary stud and has at least one electrode thereof electrically connected to the stud.

12 Claims, 16 Drawing Figures

ENCAPSULATION PACKAGE FOR A SEMICONDUCTOR ELEMENT

The present invention relates to the encapsulation of semiconductor devices, and more particularly to an improved encapsulation package for a semiconductor device operating in the ultra-high frequency band.

In prior art packages for a semiconductor device operating in the ultra-high frequency range of up to several gigahertz, an electrode structure of strip-line geometry has been used in order to prevent losses due to impedance mismatching at the input and output terminals against an external circuit. If, however, this semiconductor device is operated at a frequency above 8GHz, the output of the device is attenuated due to the inductance and resistance between external leads and electrodes on the semiconductor device, as well as due to the capacitance present between the electrodes. In particular, unwanted inductance that is present between the semiconductor element and the grounding potential significantly lowers the output of the semiconductor device. The prior art devices make use of insulative materials such as beryllia ceramics on which the electrodes are formed by metallization, resulting in a significant amount of parasitic capacitance between the electrodes. In a strip-line geometry structure, the efficiency of heat dissipation is limited because the semiconductor element is installed on a metallized layer deposited on a ceramic member. This has made the conventional package unsuited for use in high-power semiconductor devices.

One prior art approach to this problem has been to place the semiconductor element directly on the grounding metallized layer in the package having strip-line geometry, in which the input electrode directly faces the output electrode by way of an air capacity. In such structure, an input signal applied to the input electrode is directly transferred to the output electrode, causing a large loss on the input signal. Furthermore, the output signal tends to be fed back to the input electrode whereby oscillation will readily occur.

Therefore, it is an object of the invention to provide a semiconductor device capable of operation under desirable electrical characteristics in an ultra-high frequency band.

It is a further object of the invention to provide a semiconductor device having an improved efficiency of heat dissipation. It is another object of the invention to provide a semiconductor device of the type described having a substantially reduced interelectrode capacitance.

According to the present invention, a semiconductor device comprises a metal substrate, having at least one insulative member and an auxiliary metal stud formed on its main surface. A semiconductor element is bonded onto the auxiliary metal stud, and first and second electrode members are formed on the insulative member parallel to the main surface of the metal substrate and arranged in mutually opposing positions with respect to the auxiliary stud. The electrodes of the semiconductor element are connected to the first and second electrode members. The height of the auxiliary metal stud is sufficient to shield electrostatically the first and second electrode members from each other. The height of the auxiliary metal stud may be the same as or larger than a height which is equal to the thickness of the insulative member minus the thickness of the semiconductor element. Alternatively, the auxiliary metal stud may be provided on the top surface with two banks, the height from the bottom of the auxiliary metal stud to the top of the banks being equal to or larger than the thickness of the insulative member. External leads are connected to the electrode members and to the metal substrate.

In the semiconductor device of this invention, the metal substrate is substantially parallel with the first and second electrode members to make it readily feasible to establish impedance matching with an external circuit, thus best utilizing the known structure of strip-line geometry. Because the semiconductor element is placed directly on the metal stud, which is normally connected to a ground potential through the metal substrate for operation in an ultra-high frequency band, the inductance and resistance hardly exist between the semiconductor element and the ground potential. Furthermore, according to the invention, the first and second electrode members face each other by way of a gap of air whose dielectric constant is minimum and hence the capacitance between these electrodes is minimized. Also, because the first and second electrode members for external leads are kept largely distant from the grounding electrode, the capacitance between the grounding electrode and the external lead electrodes is also minimized.

Furthermore, because the auxiliary metal stud at ground potential is disposed between the semiconductor element and the external lead electrodes at a height sufficient to shield the electrodes from each other, the transmission loss between the electrodes is minimized and a signal reflected from one electrode does not affect the other electrodes. This enables the semiconductor device of this invention to operate stably and offer a large gain without the likelihood of causing oscillation.

Still further, the invention contributes much to efficient heat dissipation because the semiconductor element is placed on the metal substrate through the auxiliary metal stud. If the metal substrate is placed on a heat dissipation stud, the resultant semiconductor device can offer a greater output.

The other objects, features and advantages of the present invention will become more apparent from the following detailed description of preferred embodiments, as illustrated in the accompanying drawings, wherein.

Figure 1:
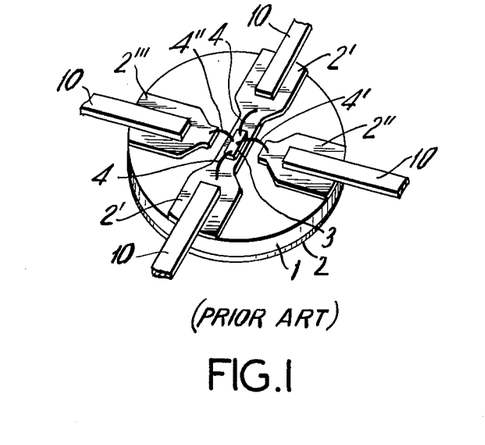
FIG. 1 is a perspective view showing a conventional semiconductor package of strip-line structure.

Referring now to FIG. 1, there is shown a perspective view of a conventional field effect transistor operating in an ultra-high frequency band, wherein metallized conductors 2, 2′, 2″ and 2‴ are disposed on both sides of a ceramic substrate 1, thereby forming a strip-line structure. A semiconductor element 3 is mounted on the conductor 2′, and the source, gate and drain electrodes of the semiconductor element 3 are connected electrically to the conductors 2′, 2″ and 2‴ by way of fine metal wires 4, 4′ and 4″ so that, for example, the source electrode contacts the conductor 2′; the gate electrode, the conductor 2″; and the drain electrode, the conductor 2‴. In this structure, however, the parasitic reactance present near the area where the semiconductor element 3 is installed adversely affects the electrical characteristics of the field effect transistor. Further, abnormal oscillation is very liable to occur as the frequency becomes higher because of the parasitic reactance. Still further, the poor heat dissipation deteriorates the electrical characteristics of the field effect transistor. The prior art has not yet succeeded in providing a practical field effect transistor for effective use in ultra-high frequency applications.

Figure 2A:
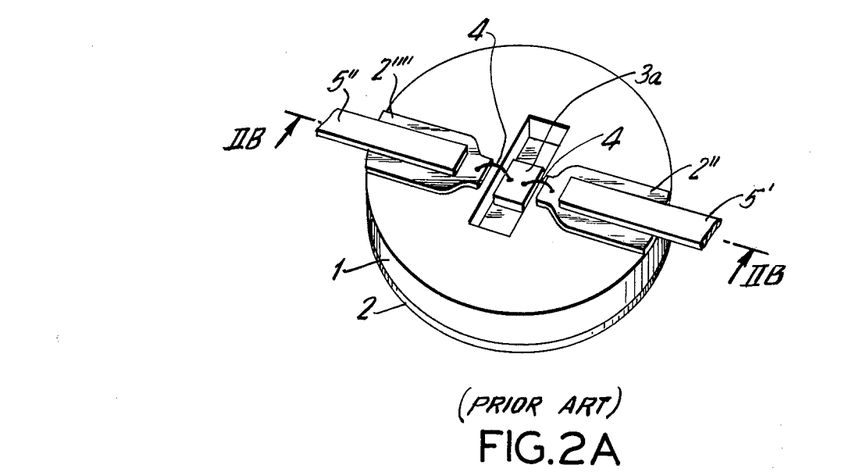
FIG. 2A is a perspective view, and 2B is a cross sectional view taken across a line IIB—IIB of FIG. 2A, illustrating another example of a conventional semiconductor package.
Figure 2B:
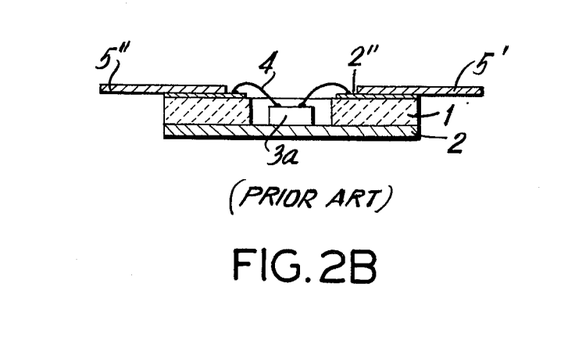

FIG. 2, schematically illustrates a prior art bipolar semiconductor device operated at ultra-high frequencies. This semiconductor device is of a strip-line structure similar to the one shown in FIG. 1. More specifically, a transistor element 3a is installed directly on a metal plate 2 in an attempt to improve the heat dissipation. Metallized layers 2″ and 2‴ are formed on the opposite surface of a ceramic substrate 1. The metallized layers 2″, 2‴ and the metal plate 2 constitute a strip-line structure. The transistor element 3a has its collector electrode in contact with the metal plate 2, and its base and emitter electrodes are connected to the metallized layers 2″ and 2‴ respectively, by way of bonding wires 4. External leads 5′ and 5″ are bonded to the metallized layers 2″ and 2‴. Thus the collector has external contact through the metal plate 2; the base, through the lead 5′; and the emitter, through the lead 5″.

In this structure, the metallized layers 2′ and 2″ are capacitively connected to each other by way of ceramics and air. Therefore, the input signal to the semiconductor device directly leaks to the output side causing a reduction in gain, and the output signal is fed back to the input side to cause unwanted oscillation. Furthermore, parasitic inductance and resistance of the device are increased due to the elongated wires 4. In brief, the prior transistor illustrated in FIG. 2 also is not suited for ultra-high frequency applications.

Several preferred embodiments of the invention are now disclosed which provide semiconductor devices that are capable of providing effective performance at ultra-high frequencies.

EMBODIMENT 1

Figure 3:
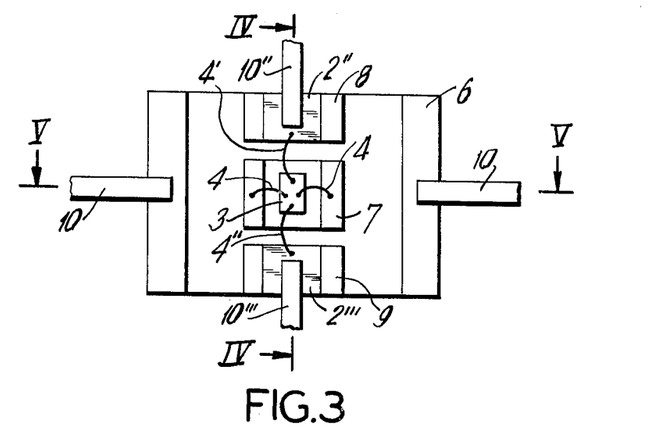
FIG. 3 is a plan view showing a semiconductor device according to a first embodiment of the invention.
Figure 4:
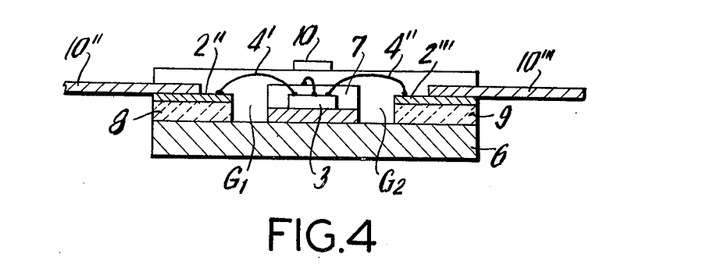
FIG. 4 is a cross-sectional view taken across a line IV—IV of FIG. 3.
Figure 5:
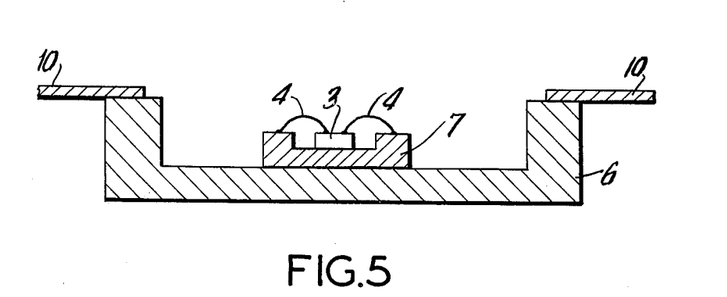
FIG. 5 is a cross-sectional view taken across a line V—V of FIG. 3.

FIGS. 3, 4 and 5 illustrate a semiconductor device according to a first embodiment of the invention, which includes a copper substrate 6, having typical demensions of, 3.5 mm wide, 4 mm long, and 0.25 mm thick, and having 1.0 mm high banks on two opposing sides. An auxiliary metal stud 7 is similar to the substrate 6 in shape, and may be typically 0.6 mm wide, 1.2 mm long, and 0.5 mm thick, having 0.2 mm high banks on two opposing sides. Auxiliary stud 7 is installed in the center of the substrate 6, thereby forming a grounding conductor of a strip-line structure. A junction type field effect transistor 3 is mounted in the center of the auxiliary stud 7. The source and substrate electrodes of the transistor 3 are connected to the two banks of the stud 7 by a wire 4. These banks serve to reduce the required length of the wire 4, which offers parasitic inductance and resistance, and to fix the electric field around the semiconductor element 3, thereby enhancing the shield effect. To this end, it is desirable that the banks of the stud 7 be at least as high as the metallized layers 2″ and 2‴ which will be described later. Insulative members 8 and 9 of beryllia ceramics, 0.55 mm high, 1.2 mm wide, and 1.35 mm long, are installed on the other opposing sides of the metal substrate 6. Leads 10″ and 10‴ are bonded to the insulative members 8 and 9, respectively, by way of the metallized layers 2″ and 2‴. These metallized layers and the substrate 6 make up a strip-line structure, and the characteristic impedance between the stud 7 and the metallized layers 2″ and 2‴ is adjusted, to a predetermined value of, for example, 50 ohms. The field effect transistor 3 has its gate and drain electrodes connected to the metallized layers 2″ and 2‴, respectively, through wires 4′ and 4″, thence through leads 10″ and 10‴ for external connections. For semiconductor devices where still smaller inductance and resistance are desired, metal tapes may be used in place of the wires 4, 4′ and 4″.

In this construction, the semiconductor element (here, transistor 3) is installed directly on the auxiliary stud 7 and hence heat is dissipated with high efficiency to allow the temperature rise of the device to be minimized so that the characteristic deterioration in the transistor 3 can be effectively precluded. Further, the distance between the grounding conductor and the source electrode is reduced; that is, the reactance component, especially the inductance component present between the grounding conductor and the source electrode of the transistor 3, can be reduced because the metal wires 4 or metal tapes 4 are curtailed by means of the use of the auxiliary stud 7 installed directly on the metal substrate 6 and connected directly to the grounding conductor. There are 0.1 mm air gaps G1 and G2 between the auxiliary stud 7 and the metallized layers 2″ and 2‴ respectively, as shown in FIG. 4. That is, the dielectric constants between the gate of the transistor 3 and the metallized layer 2″ and between the drain of the transistor 3 and the metallized layer 2‴ are of air. As a result, the electrostatic capacity therebetween is reduced and the loss resulting from the parasitic capacitance component is diminished, which makes it possible to realize an ideal strip-line structure and hence to minimize the loss in the gain.

The electric field around the transistor 3 is fixed by the existence of the auxiliary stud 7. By this effect, not only is the transistor 3 electrically shielded, but also the mutual effect of the electric field between the metallized layers 2″ and 2‴ is prevented. Therefore, the direct leakage and feedback of the signal between the metallized layers 2″ and 2‴ are both minimized, with the result that there is no decrease in power gain and no oscillation. To secure the prevention of oscillation, the top surface of the transistor 3 should be higher than the surface of the metallized layers 2″ and 2‴, preferably by making the thickness of the auxiliary stud 7 greater than the thickness of the insulative layers 8 and 9.

Table 1 shows a comparison of the transmission coefficients $S_{21}$ measured of an GaAs Schottky barrier gate field effect transistor encapsulated in the prior art package such as that shown in FIG. 1 and in the package of the first embodiment of the invention illustrated in FIGS. 3 to 5.

Table 1

| Frequency | Transmission Coefficient $S_{21}$ (prior art package) | Transmission Coefficient $S_{21}$ (package of Embodiment 1) |
| --- | --- | --- |
| 2 GHz | 3.65 (dB) | 3.5 (dB) |
| 3 GHz | 3.6 | 4.35 |
| 4 GHz | 3.1 | 5.2 |
| 5 GHz | 2.75 | 5.55 |
| 6 GHz | 2.25 | 5.85 |
| 7 GHz | 1.2 | 5.35 |
| 8 GHz | 0.6 | 4.6 |

As can be clearly seen in Table 1, the transmission coefficient $S_{21}$ the semiconductor device according to the first embodiment in is still large enough (4.6 dB) at 8 GHz, as contrasted to the fact that the transmission coefficient $S_{21}$ becomes considerably lower at frequencies above 3 GHz (only 0,6dB) in the prior art package.

EMBODIMENT 2

Figure 6:
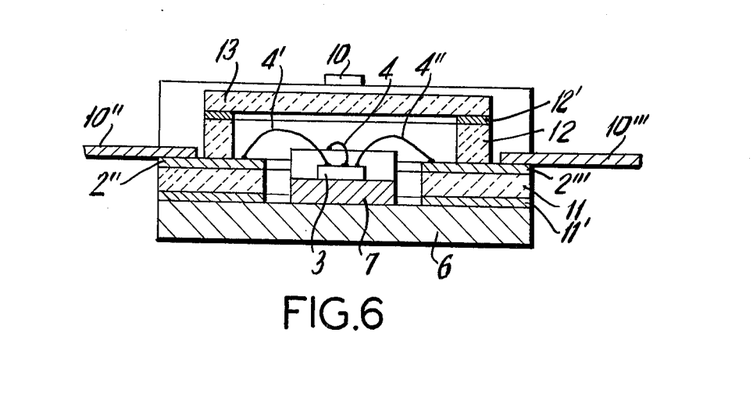
FIG. 6 is a cross-sectional view showing a semiconductor device according to a second embodiment of the invention.
Figure 7:
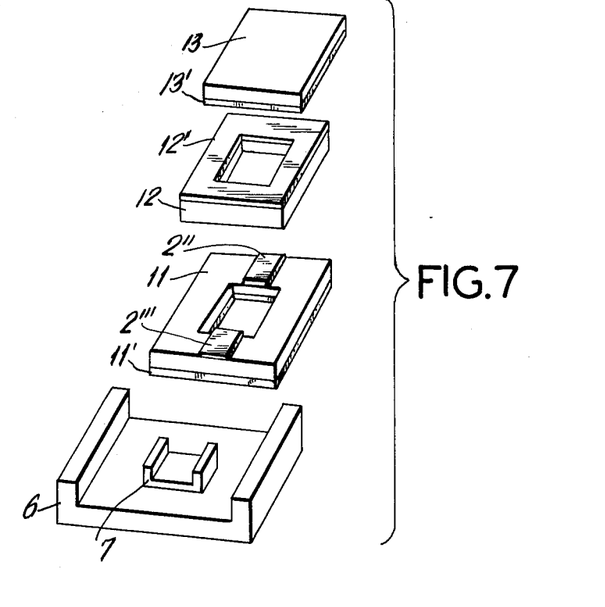
FIG. 7 is an exploded perspective view showing components used in the embodiment of the invention illustrated in FIG. 6.

The second embodiment of the invention illustrated in FIGS. 6 and 7, includes a copper substrate 6, which is typically 3.5 mm wide, 4 mm long, and 0.25 mm thick, and has 1.0 mm high banks on its two opposite sides. An auxiliary copper stud 7, which may be typically 0.6 mm wide, 1.2 mm long, and 0.5 mm thick, has 0.2 mm high banks on its two opposing sides. The auxiliary stud 7 is installed in the center of the substrate 6. The substrate 6 and auxiliary may be fabricated either separately and then bonded together, or they may be formed as an integral structure from the beginning. An insulative member 11 made, for example, of an aluminum oxide ceramic, numeral 11 indicates an insulative member of aluminium oxide ceramics, has a metallized layer 11′ over its bottom surface and metallized layers 2″ and 2‴ on its top surface. As seen best in FIG. 7 an opening typically 0.8 mm wide and 1.4 mm long is formed in the center of the insulative member 11. The insulative member 11 is bonded onto the metal substrate 6 between its banks so that auxiliary stud 7 meets the opening in the center of the insulative member. A frame member 12, which may be typically 3.5 mm wide and 3.5 mm long, and having an opening 1.5 mm wide and 1.5 mm long, is provided over the central protion of the insulative member 11. The frame member 12 is bonded integrally to the insulative member 11 in the following manner. Ceramic powder is formed into the shpaes of insulative member 11 and frame member 12. A binder is added to the ceramic powdery bodies, which are then piled and heated to sinter the ceramics. An aluminum oxide ceramic cap 13, which may typically be 3.5 mm square, is bonded integrally to the frame member 12 by soldering together the metallized layer 12′ on the top surface of the frame member 12 and the metallized layer 13′ on the bottom surface of the cap 13. External leads 10, 10″ and 10‴ are bonded to the two opposing banks of the metal substrate 6, and to the metallized layers 2″ and 2‴ respectively.

The entire metal and metallized portions of the semiconductor package are plated with nickel or gold, and a field effect transistor element 3 is mounted on the auxiliary stud 7 by, for example, gold-tin soldering. The source, drain and gate electrodes of the field effect transistor are electrically connected to the two banks of the auxiliary stud 7 and the metallized layers 2″ and 2‴, respectively, by fine metal wires (or metal tapes) 4″ and 4‴. Thereafter, the cap 13 is bonded onto the frame member 12 by soldering, whereby the semiconductor element is hermetically enclosed in the package.

In this field effect transistor device, the parasitic capacitance is markedly reduced as evidenced in Table 2 below.

Table 2

| | Capacitance between D&G | Capacitance between G&S | Capacitance between S&D |
| --- | --- | --- | --- |
| FET of the Prior Art | 0.045 pf | 0.3 pf | 0.4 pf |
| FET of the Invention | 0.007 pf | 0.15 pf | 0.15 pf |

Note 1:
The symbol D stands for drain; G, gate; and S, source.
Note 2:
The prior art FET device has a package construction as shown in FIG. 1.

According to the invention, the characteristic impedance peculiar to the strip-line structure is not disturbed even in an ultra-high frequency band. Furthermore, no signal is allowed to propagate directly between the electrodes by virtue of the shield effect of the auxiliary stud 7, the operating characteristics of the transistor can thus be maintained with utmost stability in an ultra-high frequency band.

EMBODIMENT 3

Figure 8:
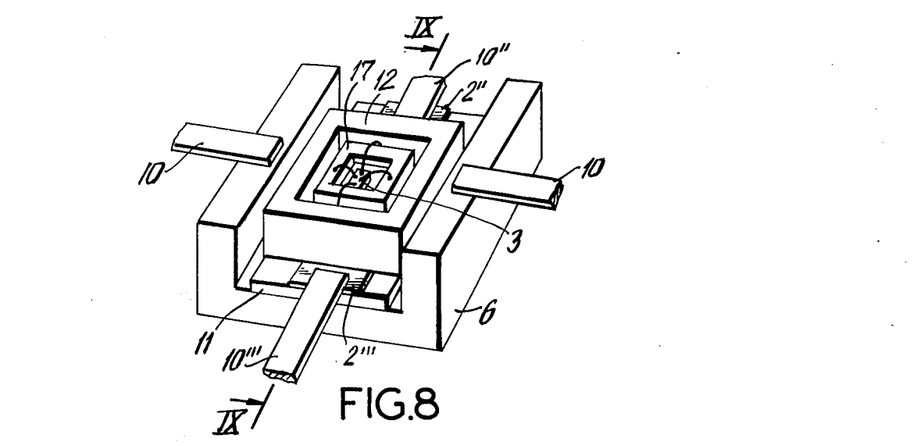
FIG. 8 is a perspective view showing a semiconductor device according to a third embodiment of the invention.
Figure 9:
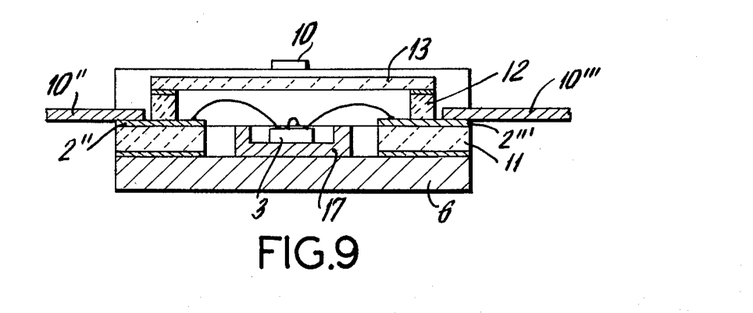
FIG. 9 is a cross-sectional view taken across a line IX—IX of FIG. 8.

Another embodiment of the invention, similar to one shown in FIGS. 6 and 7 is schematically illustrated in FIGS. 8 and 9 wherein the auxiliary stud 17 is equipped with banks on four sides. Because of these banks, the electric field nearer the metallized layers 2″ and 2‴ is fixed and the shield effect is enhanced accordingly. At the same time, the electrostatic capacitance between the metallized layers 2″ and 2‴ can further be reduced. Except for the auxiliary stud 17, the other structural elements of the device of this embodiment are the same as that of the second embodiment.

EMBODIMENT 4

Figure 10:
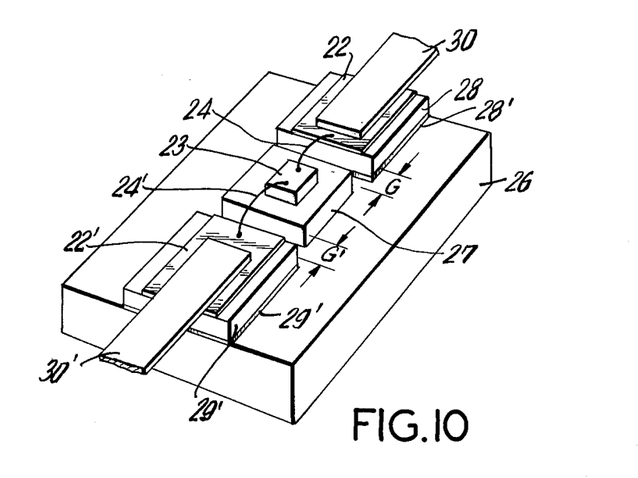
FIG. 10 is a perspective view showing a semiconductor device according to a fourth embodiment of the invention.

In a fourth embodiment of the invention shown in FIG. 10, a copper substrate 26, which may be typically 2.5 mm wide, 3.5 mm long, and 0.25 mm thick is used. An auxiliary stud 27 of copper having typical dimensions of 1.0 mm wide, 0.6 mm long, and 0.55 mm thick, is soldered onto the central area of the surface of the substrate 26. Insulative members 28 and 29 of, for example, a beryllia ceramic, each being typically 1.2 mm wide, 1.25 mm long, and 0.55 mm thick, are bonded onto the opposing sides of the surface of the substrate 26 by soldering through metallized layers 28' and 29' which are deposited in advance over the bottom surfaces of the insulative members 28 and 29, respectively, such that gaps G and G' of 0.2 mm are formed between the auxiliary stud 27 and the respective one of the insulative members 28 and 29. The top surfaces of the insulative members 28 and 29 are partially coated with metallized layers 22 and 22', respectively, each being typically 0.6 mm wide and 1.25 mm long, to which external leads 30 and 30' of Kovar (a nickel-iron-cobalt alloy) are bonded. The metal substrate stud 26 and metallized layers 22 and 22' constitute a strip-line structure of which the characteristic impedance is determined to a given value, such as 50 ohms, by suitably selecting the thicknesses of the insulative members 28 and 29 and the widths of the metallized layers 22 and 22'. A bipolar transistor 23 is placed on the auxiliary stud 27, and its emitter and base electrodes are connected to the metallized layers 22 and 22', respectively, by way of wires 24 and 24' or metal tapes. The collector electrode of the transistor 23 is bonded to the auxiliary stud 27 by a solder and is externally lead out by use of the substrate 26.

As described, the auxiliary stud 27 is as thick as 0.55 mm. With the aim to enhance the shield effect by the auxiliary stud 27 and to facilitate the connection of wires 24 and 24' in position, it is important that the thickness of the auxiliary stud 27 be determined so that the surface of the transistor 23 stands as high as or higher than the metallized layers 22 and 22'.

In this embodiment, because the transistor 23 is mounted on the metal substrate 26 through the auxiliary stud 27, the heat produced in the transistor 23 is transferred directly to the metal substrate 26, thereby to permit efficient heat dissipation, thus preventing the electrical characteristics of the transistor from being deteriorated due to inefficient heat dissipation. Furthermore, because the collector of the transistor is connected to an external circuit by way of the auxiliary stud 27 and the metal substrate 26, both of which are good electrical conductors, the parasitic industance present between the collector of the transistor 23 and the external circuit is minimized.

Still further, because of the gaps G and G' (G ≈ G') between the conductive auxiliary stud 27 and each of the metallized layers 22 and 22', the dielectric constant across the open gap is smaller than that across, for example, ceramics with which the gap is filled. As a result, the parasitic capacitance between the auxiliary stud 27 and each of the metallized layers 22 and 22' is reduced and, accordingly, the parasitic capacitance between the collector and the emitter of the transistor 23, that between the collector and the base thereof, is reduced. Table 3 shows a comparison of the parasitic capacitance measured of the prior art package (FIG. 2) and of the package of the embodiment of FIG. 10.

Table 3

|  | Capacitance between C&B | Capacitance between E&B | Capacitance between C&E |
|---|---|---|---|
| Prior Art | 0.3 pf | 0.07 pf | 0.3 pf |
| Invention | 0.1 pf | 0.01 pf | 0.1 pf |

Table 3 clearly indicates that the capacitance between the electrodes of the semiconductor element (transistor) can be reduced according to the invention. In addition, the semiconductor package of the invention does not appreciably deteriorate the characteristics of a transistor mounted therein, which is designed for operation in the ultra-high frequency band. In other words, the package of the invention can contribute much to the improvement in the high frequency characteristics of a semiconductor element encapsulated.

Moreover, since the transistor 23 is mounted on the auxiliary stud 27 so that the transistor stands as high as the metallized layers 22 and 22', the length of the wires 24 and 24' bonded thereto can be reduced accordingly, thereby making it possible to minimize the parasitic inductance of the wires 24 and 24'.

This type of semiconductor device can be used in various electronic circuits such as, for example, a reflex amplifier using a transistor with its collector fixed at a given potential. In such application, the electric field around the transistor 23 is fixed, causing an electrostatic shield between the metallized layers 22 and 22'. Hence, signal leakage and reflection between these metallized layers are both extremely reduced and thus a highly efficient and stable amplifier can be realized. In brief, an electronic circuit associating the semiconductor device of this invention is capable of stable operation with high efficiency even in the ultra-high frequency band, owing to the unique strip-line structure, and lowered parasitic capacitance and inductance components.

EMBODIMENTS 5 and 6

Figure 11:
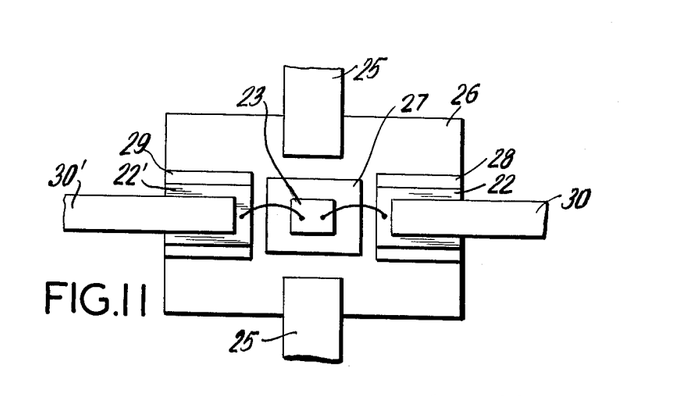
FIG. 11 is a plan view showing a semiconductor device according to a fifth embodiment of the invention.
Figure 12:
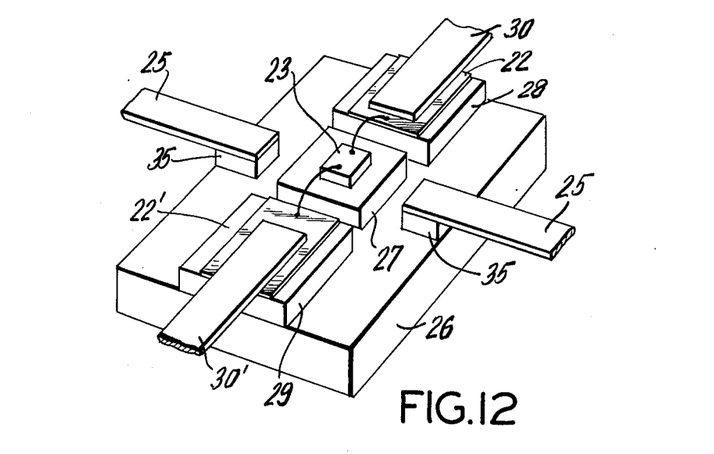
FIG. 12 is a perspective view showing a semiconductor device according to a sixth embodiment of the invention.

Other embodiments of the invention are schematically illustrated in FIGS. 11 and 12. The semiconductor devices shown therein have external leads 25 through which the collector electrode is to be in electrical connection with an external circuit. Except for the provision of the external leads 25, each of semiconductor devices of these embodiments is the same in structure as that of the fourth embodiment illustrated in FIG. 10.

In FIG. 11, two leads 25 are soldered directly on the upper surface of the substrate 26 at two opposing positions, respectively, whereas in FIG. 12, platelets 35 of copper of 0.55 mm thick are soldered to the metal substrate 26 at two opposing positions, and the leads 25 are bonded onto the platelets 35 by soldering. Thus, according to the embodiment shown in FIG. 12, external leads 25, 30 and 30' are all formed in the same plane.

The structures of these embodiments make available the advantage that the collector electrode can easily be led out for connection to an external circuit. In particular, the device shown in FIG. 12, in which all the external leads are in the same plane, can readily be connected to the external circuit.

EMBODIMENT 7

In a seventh embodiment of the invention schematically illustrated in FIGS. 13 and 14, a transistor element 23 is hermetically encapsulated in the following manner.

A copper auxiliary stud 27, which may typically be 1.0 mm wide, 0.6 mm long and about 0.55 mm thick, is soldered to the center of a copper substrate 26, 2.5 mm wide, which may typically be 3.5 mm wide, 3.5 mm long and 0.25 mm thick. There is provided an insulative member 31 of beryllia ceramic which may have typical 2.5 mm wide, 3.5 mm long and 0.55 mm thick. Insulative member 31 has in its center an opening 39, typically 1.2 mm wide and 1.0 mm having in its center an opening 39, 1.2 mm wide and 1.0 mm long, and a metallized layer 31' is provided on its back surface. The insulative member 31 is bonded onto the metal substrate 26 by soldering so that the auxiliary stud 27 is located in an opening 39 of the insulative member 31. Metallized layers 22 and 22' for the emitter and base electrodes are formed in advance on the top surface of the insulative member 31. The thickness of the auxiliary stud 27 is determined so that the metallized layers 22 and 22' stand as high as the transistor 23 when the latter is installed. A frame member 32 a beryllia ceramic of 2.5 mm square having in the center an opening of 1.2 mm square and having on the top surface a metallized layer 32', is placed on the insulative member 31, and the frame member 32 and the insulative member 31 are unified by sintering. Leads 30 and 30' of Kovar are soldered to the metallized layers 22 and 22', respectively, and then all the metal and metallized portions are plated with gold. The transistor 23 is mounted on the auxiliary stud 27, and its base and emitter electrodes are electrically connected to the metallized layers 22 and 22', respectively, by wires 24 and 24'. A cap member 33 of copper of 2.5 mm square and 0.3 mm thick is soldered to the metallized layer 32' of the frame member 32 and thereby the transistor 23 is hermetically encapsulated.

In this structure, low impedance metal foils may be used in place of the wires 24 and 24' whereby the impedance of the electrode leads can be further lowered.

In this embodiment, similar to the fourth embodiment, the semiconductor device of the invention is capable of operation with high reliability and stability to a sufficiently high cutoff frequency.

Table 4 shows a comparison between the oscillation output obtained with a CR oscillator using the semiconductor device of this embodiment and with a CR oscillator using the conventional transistor shown in FIG. 2.

Table 4

| Frequency | Oscillation Output (prior art package) | Oscillation Output (package of Embodiment 7) |
|---|---|---|
| 3.5 GHz | 24 dBm | |
| 3.7 GHz | | 28 dBm |
| 4.0 GHz | | 28 dBm |
| 4.05 GHz | 22 dBm | |
| 4.25 GHz | 21 dBm | 24 dBm |
| 4.5 GHz | 19 dBm | 21.7 dBm |
| 4.7 GHz | 17.5 dBm | |
| 4.8 GHz | | 20 dBm |
| 5.0 GHz | 15 dBm | |
| 5.1 GHz | 10 dBm | |
| 5.2 GHz | oscillation stopped | 15 dBm |

It is apparent from Table 4 that the semiconductor device of this embodiment can operate in an ultra-high frequency band and deliver a large output at frequencies above 5 GHz. This capability is available because of the low capacitance between the electrodes, the low impedance, especially the low inductance of the external lead from the collector electrode, and the low signal leakage and the low output feedback between the emitter and base electrodes.

EMBODIMENT 8

Figures 13, 14, 15:
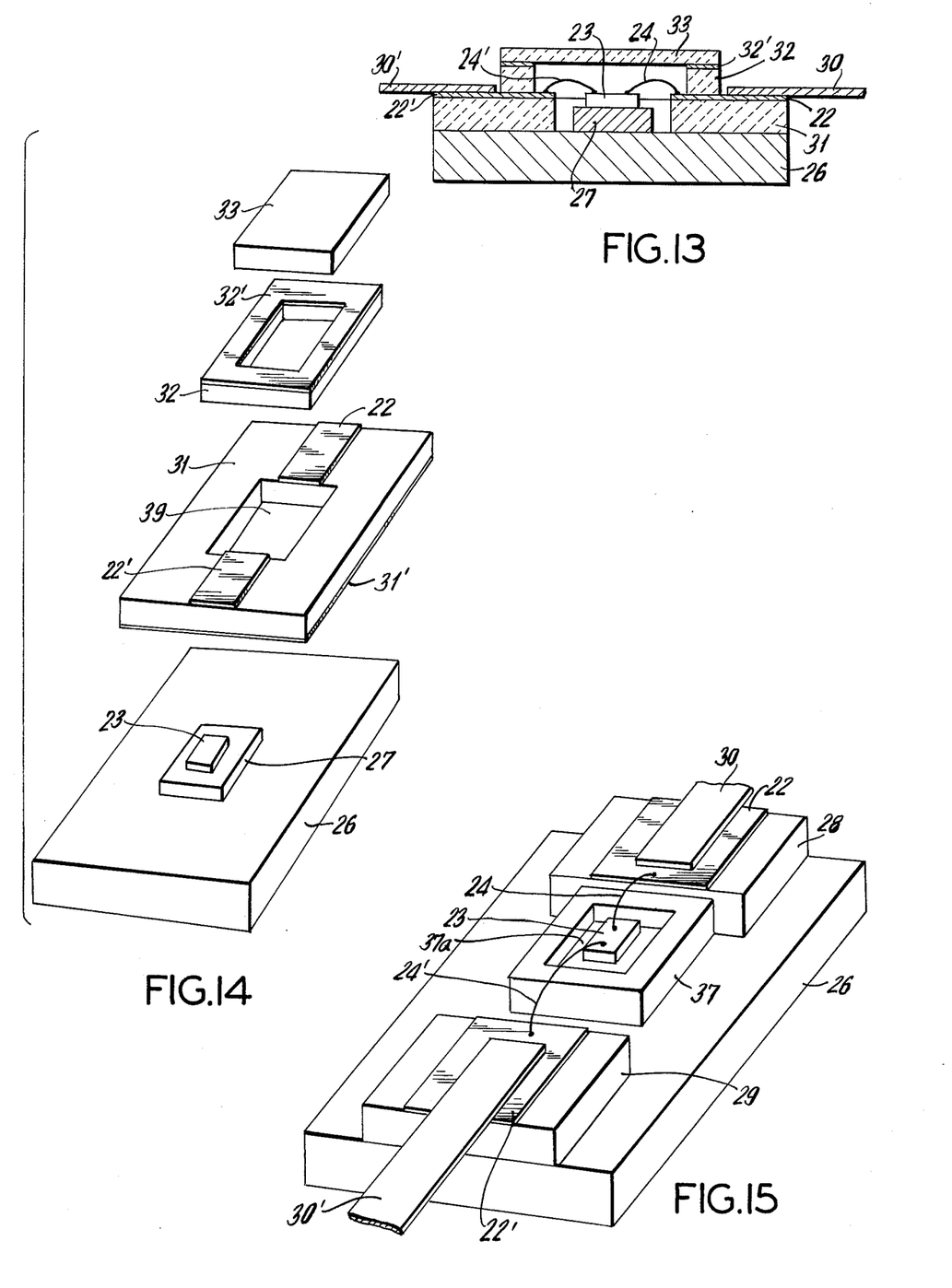
FIG. 13 is a cross-sectional view of a semiconductor device according to a seventh embodiment of the invention.
FIG. 14 is an exploded perspective view showing components used in the embodiment of the invention illustrated in FIG. 13.
FIG. 15 is a perspective view showing a semiconductor device according to an eighth embodiment of the invention.

Referring to FIG. 15, more desirable shield is realized for the transistor element and the metallized layers by replacing the auxiliary stud 27 of the device shown in FIG. 10 with an auxiliary stud 37, which may typically be 1.0 mm wide, 0.6 mm long, and 0.6 mm thick, having in the center a hollow 37a which may be 0.4 mm square and 0.3 mm deep. The transistor element 23 is placed in the hollow 37a of stud 37.

According to this embodiment, the metallized layers 22 and 22' are thoroughly shielded from each other by the auxiliary stud 37 and thus signal leakage and feedback are nearly perfectly avoided.

According to the invention, as has been described in detail, a semiconductor device capable of operation with high efficiency and stability even in the ultra-high frequency band can be obtained.

The semiconductor element that can be encapsulated according to this invention includes not only a bipolar transistor as herein specifically described, and a field effect transistor but also integrated circuit elements. For the encapsulation of integrated circuit elements, there should be as wide a gap as possible between wires for connecting the electrodes of the element, and the metallized layers between which no signal leakage or feedback is desired should be located at mutually opposing positions.

As has been described by way of example, the invention makes it readily feasible to minimize the parasitic reactance in an encapsulated semiconductor element such as a bipolar transistor, a field effect transistor and integrated circuit elements, thereby permitting the semiconductor device to be operated stably in the ultra-high frequency band. Because the structure according to the invention enables efficient heat dissipation from the semiconductor element, the thermal characteristic is stabilized and a highly reliable semiconductor device applicable to ultra-high frequency bands can be obtained.

Although specific embodiments of the invention have been disclosed herein in detail, it is to be understood that this is for the purpose of illustrating the invention and should not be construed as necessarily limiting the scope of the invention.

What is claimed is:

1. A semiconductor device comprising a metal substrate maintained at a constant voltage; first and second insulative segments disposed on a main surface of said metal substrate; an auxiliary metal stud mechanically mounted on and electrically connected to said main surface of said metal substrate at a position between said first and second insulative segments; a semiconductor element having a first, a second, and a third electrode, said semiconductor element being mounted onto said auxiliary metal stud; first and second electrode members formed respectively on said first and second insulative segments, said first and second electrode members being parallel with said main surface of said metal substrate and positioned at the opposing sides of said auxiliary metal stud so that said first electrode member, said auxiliary metal stud, and said second electrode member are arranged in a line; means for electrically connecting said first and second electrodes of said semiconductor element to said first and second electrode members, respectively; and means for electrically connecting said third electrode of said semiconductor element to said auxiliary metal stud; the height of said auxiliary metal stud being selected to shield electrostatically said first and second electrode members from each other.

2. The semiconductor device as claimed in claim 1, wherein said auxiliary metal stud has a central hollow portion, and said semiconductor element is mounted in said hollow portion of said auxiliary metal stud.

3. The semiconductor device as claimed in claim 2, wherein the height of said auxiliary metal stud is greater than that of said insulative member, and the depth of said hollow portion of said auxiliary metal stud is determined so that the upper surface of said semiconductor element is not lower than the upper surface of said insulative member.

4. The semiconductor device as claimed in claim 1, further comprising a first lead and a second external lead fixed to said first and second electrode members, respectively.

5. The semiconductor device as claimed in claim 4, further comprising a pair of external leads fixed to said metal substrate in the opposing positions with respect to said auxiliary metal stud.

6. The semiconductor device as claimed in claim 1, wherein said auxiliary metal stud is of rectangular parallelepiped shape with a height so determined that the upper surface of said semiconductor element is not lower than the upper surface of said insulative member.

7. The semiconductor device as claimed in claim 1, in which said auxiliary metal stud includes a base and first and second banks extending from opposing sides of said base, said third electrode being electrically connected by said connecting means to one of said banks.

8. The semiconductor device as claimed in claim 7, in which the height of said banks above said major surface of said substrate is at least as great as the distance of said first and second electrode member from said major surface of said substrate.

9. The semiconductor device as claimed in claim 7, in which first and second air gaps are formed between said auxiliary metal stud and said first and second electrode members, respectively.

10. The semiconductor device as claimed in claim 1, in which said one insulative member includes a metallized layer on its lower surface in contact with said major surface of said substrate, and includes said first and second electrode member formed on its upper surface, said insulative member having a central opening surrounding said auxiliary metal stud.

11. The semiconductor device as claimed in claim 10, further comprising a frame member having a central opening therein mounted on the upper surface of and provided over the central opening of said insulative member.

12. The semiconductor device as claimed in claim 11, in which a metallizing layer is formed on the upper surface of said frame member, and further comprising an insulating cap having a metallized layer formed on its lower surface and connected to said metallizing layer.

* * * * *